(12) United States Patent
Manczak et al.

(10) Patent No.: US 7,844,702 B1
(45) Date of Patent: Nov. 30, 2010

(54) METHOD AND APPARATUS FOR PHYSICALLY LOCATING A NETWORK COMPONENT

(75) Inventors: Olaf Manczak, Hayward, CA (US); James C. Beck, Berkeley, CA (US)

(73) Assignee: Oracle America, Inc., Redwood City, CA (US)

( * ) Notice: Subject to any disclaimer, the term of this patent is extended or adjusted under 35 U.S.C. 154(b) by 974 days.

(21) Appl. No.: 11/284,351

(22) Filed: Nov. 21, 2005

(51) Int. Cl.
*G06F 15/173* (2006.01)

(52) U.S. Cl. ................ 709/224; 705/28; 709/223

(58) Field of Classification Search ......... 709/223, 709/224; 705/28
See application file for complete search history.

(56) References Cited

U.S. PATENT DOCUMENTS

| | | | | |
|---|---|---|---|---|
| 3,989,929 A | * | 11/1976 | Treiber | 235/432 |
| 5,745,682 A | * | 4/1998 | Keenan | 709/220 |
| 5,754,767 A | * | 5/1998 | Ruiz | 709/220 |
| 5,867,801 A | * | 2/1999 | Denny | 701/35 |
| 5,959,275 A | * | 9/1999 | Hughes et al. | 235/375 |
| 6,591,297 B1 | * | 7/2003 | Challener et al. | 709/224 |
| 6,601,097 B1 | * | 7/2003 | Cheston et al. | 709/222 |
| 6,854,072 B1 | * | 2/2005 | Cagle et al. | 714/15 |
| 6,870,464 B2 | * | 3/2005 | Okamura | 340/10.51 |
| 7,051,095 B1 | * | 5/2006 | Cantwell | 709/223 |
| 7,133,804 B2 | * | 11/2006 | Tonack et al. | 702/184 |
| 7,350,715 B2 | * | 4/2008 | Pradhan et al. | 235/492 |
| 2003/0046339 A1 | * | 3/2003 | Ip | 709/203 |
| 2003/0177211 A1 | * | 9/2003 | Cyr et al. | 709/222 |
| 2006/0106930 A1 | * | 5/2006 | Shaffer | 709/224 |

* cited by examiner

*Primary Examiner*—Aaron Strange
*Assistant Examiner*—James Q Forman
(74) *Attorney, Agent, or Firm*—Osha • Liang LLP (57) ABSTRACT

A method for determining a physical location of a network component includes placing the network component in the physical location, determining a location value corresponding to the physical location of the network component using a location scheme, associating an electronic location tag (ELT) having the location value with the physical location, and obtaining the location value corresponding to the physical location of the network component.

16 Claims, 9 Drawing Sheets

METHOD AND APPARATUS FOR PHYSICALLY LOCATING A NETWORK COMPONENT

BACKGROUND

A rack-mountable server (hereafter referred to as a "server") is typically housed in a server rack. A server rack is a device that holds a large number of servers, which are often identical or similar in design. While these servers may be on-site, often the servers are located at remote locations to save space or maintenance costs and to provide a physically secure location for the servers. One common approach is to install the servers in a server farm. A server farm typically includes anywhere from tens to multiple thousands of servers located together and used by one or more companies.

Regardless of the physical location of a server, a user generally interfaces with the server through a remote interface. In a typical implementation, a user interfaces with a server through a remote computer system connected to the server over a network. The server is typically accessed through a unique network address, which allows the user to connect to the server from the remote location.

If a server or a component within the server malfunctions or fails, it may become necessary to service the faulty server or component within the server. Security restrictions due to multiple companies sharing space in a server farm, a server farm being located in a remote location, or any number of other factors may prevent the user from personally servicing the faulty server or component within the server. To further complicate the service required for servers, some servers hold one or more field replaceable units (FRUs) such as removable hard drives or other components that may require frequent service.

As the server is typically accessed from a remote location via a network, in order to service a faulty server housed at a server farm, some identification associated with the faulty server is necessary to physically locate it among any number (potentially thousands) of identical servers.

Two conventional techniques have been employed in server farms to allow a service technician to locate a particular server in the server farm. If the server requiring service is still functioning on some level, then the remote user may trigger lights on the server to blink. Further, depending on the particular problem with the server, the remote user may trigger the lights to blink in certain manner (i.e., at a certain speed, for a specific duration, in a particular pattern, lights of only a specific color may blink, etc.). As an alternative to blinking lights, some servers may also emit a noise (such as a beep) to indicate that the server is faulty.

While the aforementioned techniques enable a service technician to locate a server in the server farm, servers that are entirely nonfunctional clearly cannot use either of the aforementioned techniques, as the aforementioned techniques require power. In such situations, the service technician may locate the particular server using the serial number of the server along with information about the possible location of the server in the server farm. Regardless of which technique is used to locate the server, locating a particular server to service may take a significant amount of time.

SUMMARY

In general, in one aspect, the invention relates to a method for determining a physical location of a network component, including placing the network component in the physical location, determining a location value corresponding to the physical location of the network component using a location scheme, associating an electronic location tag (ELT) comprising the location value with the physical location, and obtaining the location value corresponding to the physical location of the network component.

In general, in one aspect, the invention relates to a network computing system, including a network component stored in a physical location within the network computing system, and an electronic location tag (ELT) associated with the network component, which includes a human-readable form of a location value, and a machine-readable form of the location value, where the location value corresponds to the physical location of the network component.

In general, in one aspect, the invention relates to a computer readable medium having software instructions for determining a physical location of a network component, the software instructions executable on a computer to place the network component in the physical location, determine a location value corresponding to the physical location of the network component using a location scheme, associate an electronic location tag (ELT) having the location value with the physical location, and obtain the location value corresponding to the physical location of the network component.

Other aspects of the invention will be apparent from the following description and the appended claims.

DETAILED DESCRIPTION

Exemplary embodiments of the invention will be described with reference to the accompanying figures. Like items in the figures are shown with the same reference numbers. Further, the use of "ST" in the figures is equivalent to the use of "Step" in the detailed description below.

In embodiments of the invention, numerous specific details are set forth in order to provide a more thorough understanding of the invention. However, it will be apparent to one of ordinary skill in the art that the invention may be practiced without these specific details. In other instances, well-known features have not been described in detail to avoid obscuring the invention.

Embodiments of the invention relate to methods and apparatus for determining a physical location of a network component. More specifically, one or more embodiments of the invention relate to methods and apparatus for physically locating a network component among a number of similar (or identical) components.

Figure 1A:
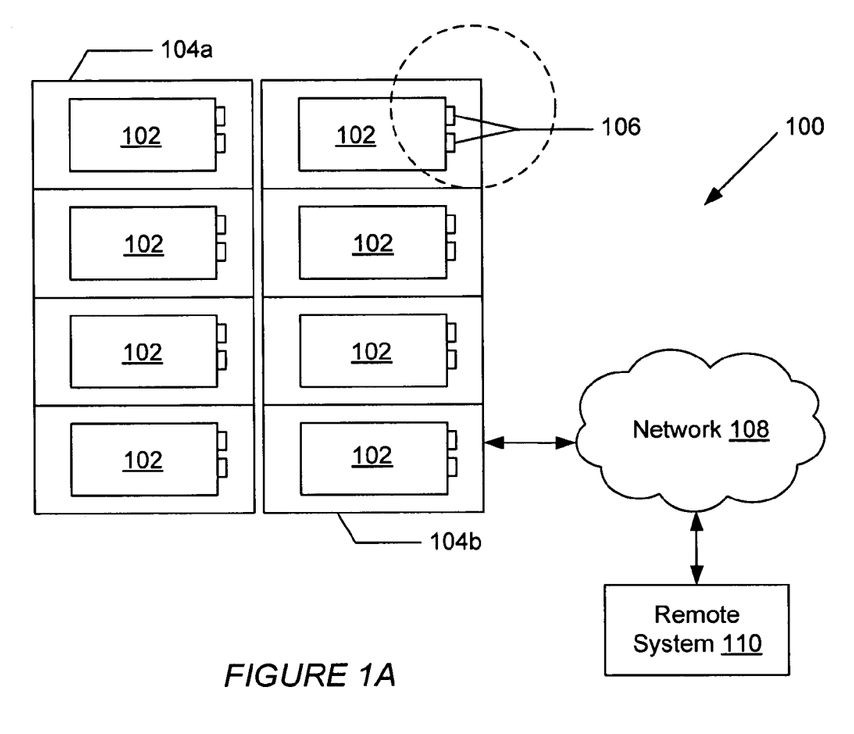
FIG. 1A shows a schematic view of a network in accordance with an embodiment of the invention.

FIG. 1A shows a network system (100) in accordance with an embodiment of the invention. As shown in FIG. 1A, a plurality of network components (102) are located in component racks (104a, 104b). In one embodiment of the invention, each network component (102) corresponds to a rack-mountable server or any other electrical component capable of being managed remotely. Those skilled in the art will appreciate that the component racks (104a, 104b) may be configured to store any number of network components (or electrical components) in any configuration.

Each network component (102) is associated with two electronic location tags (ELTs) (106). In FIG. 1A, the ELTs (106) are positioned adjacent to the network component (102) with which they are associated. However, those skilled in the art will appreciate that the proximity and location of the ELTs (106) with respect to the network components (102) with which they are associated may vary with the implementation of the invention. Further, one skilled in the art will appreciate that embodiments of the invention may include network components associated with one or more ELTs, where an ELT includes one or more assignable values. In other words, one or more assignable values (digits) of an ELT may be independently set by a user. Embodiments of the invention describing the use of one or more ELTs are described in detail below.

Continuing with the discussion of FIG. 1A, a remote system (110) is connected to each of the plurality of network components (102) in the component racks (104a, 104b) via a network (108) (e.g., the Internet). The remote system (110) allows a user to administer the network components (102) remotely.

Figure 1B:
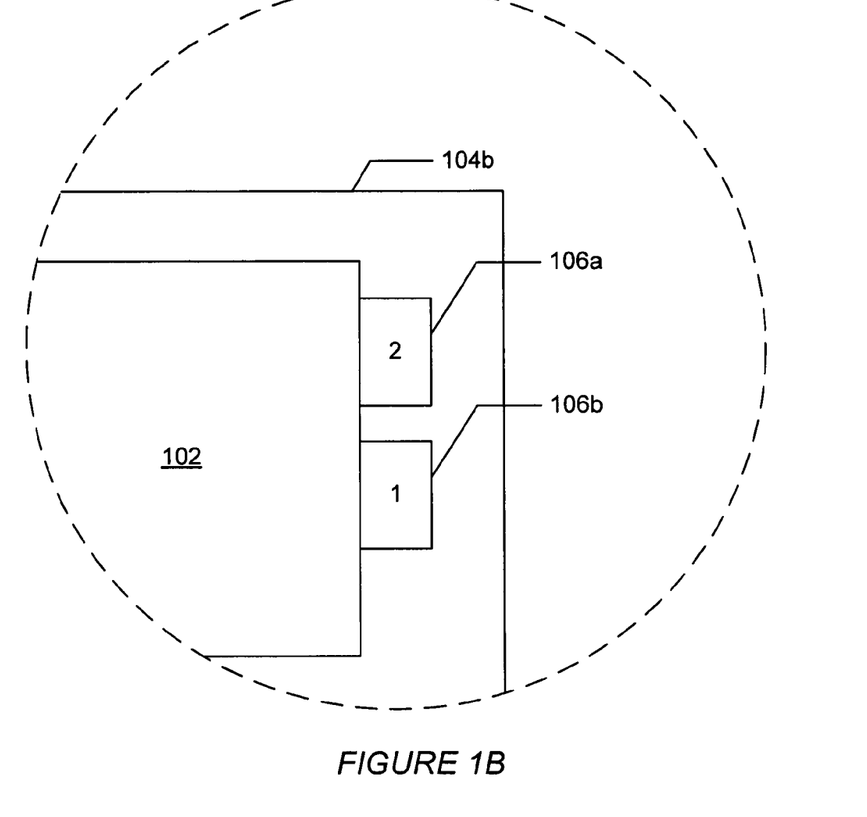
FIG. 1B shows a portion of the schematic view of the network of FIG. 1A, enlarged for magnification purposes, in accordance with an embodiment of the invention.

FIG. 1B shows a magnified portion of the network system of FIG. 1A. In
FIG. 1B, the network component (102) is located on a particular shelf in the component rack (104b). Two ELTs (106a, 106b) are located adjacent to the network component (102). The first ELT (106a) has a human-readable value "2," which is human-assigned, appearing on a face of the ELT. Similarly, the second ELT (106b) has a human-assigned and human-readable value "1" appearing on a face of the ELT. In this embodiment, the value appearing on the first ELT (106a) corresponds to the rack number (i.e., component rack number 2), and the value appearing on the second ELT (106a) corresponds to the shelf number (i.e., shelf number 1) within the component rack (104b). Thus, the human-assigned and human-readable values of the ELTs are essentially location values, which uniquely identify the physical location of the particular network component (102) (i.e., component (102) is located on shelf 1 of component rack 2).

Those skilled in the art will appreciate that while the system of FIG. 1A depicts two ELTs associated with each network component, a network system may use any number of ELTs determined necessary to identify the network component. The number of ELTs used may be based on, for example, the storage system used and the method of arranging the network components.

Figure 2:
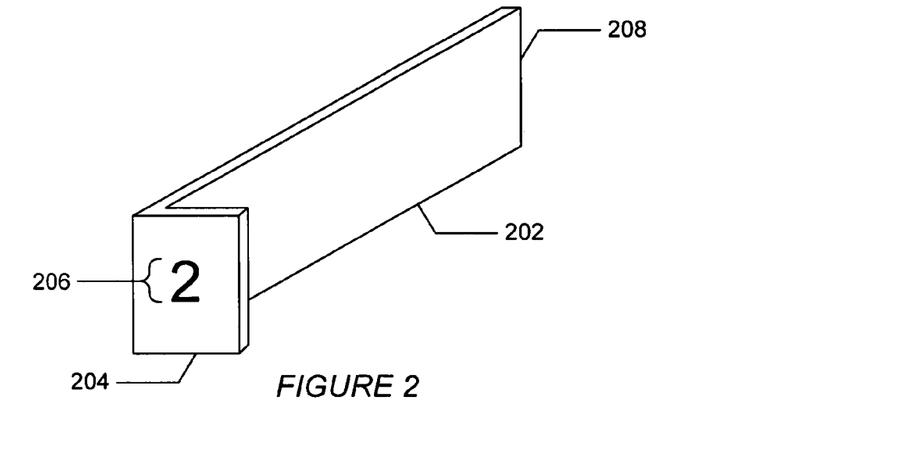
FIGS. 2-3 and 5 show electronic location tags in accordance with embodiments of the invention.

FIG. 2 depicts an ELT (202) in accordance with an embodiment of the invention. In one embodiment of the invention, the ELT (202) is constructed from a plastic material, but metal or another suitable material may also be used. The ELT (202) includes a human-assigned and human-readable value "2" (206) on a first end (204) of the ELT (202). A second end (208) of the ELT (202) is configured to include a machine-readable form of the location value corresponding to the human-readable form of the location value. Further, the ELT (202) is configured to be installed inside or outside the chassis of a network component (not pictured) or in a determined location in a component rack (e.g., a server rack) as shown in FIGS. 1A and 1B. This configuration of the ELT allows the ELT to be installed inside or outside the chassis of a network component with little or no physical modification to the network component chassis or the component rack. For example, in a standard server rack, spaces typically exist between installed network components (or electrical components) and the frame of the component rack. Accordingly, in one embodiment of the invention, the ELTs are designed such that one or more ELTs may be inserted in the existing spaces between installed network components (or electrical components) and the frame of the component rack. Further, in one embodiment of the invention, the ELT (202) is designed such that the human-readable location value (206) on the first end (204) of the ELT (202) may be easily read by, for example, a service technician.

Those skilled in the art will appreciate that the human readable form of the location value of the ELT may be any value that may be understood by a user, such as, but not limited to, any combination of alphanumeric or pictorial symbols (e.g., "2 ■," "*," "B4," "Ay," "⩘4," etc.). Further, those skilled in the art will appreciate that other representations of alphanumeric characters (e.g., binary numbers, bar codes, etc.) may be used in addition to a human-readable value. Further, those skilled in the art will appreciate that the machine-readable form of the location value may correspond to any machine-readable form that can be understood directly by the network component or via a sensor/reader operatively connected to the network component. For example, the machine-readable form of the location value may correspond to a machine-readable form that may be obtained using optical means (e.g., an optical reader), mechanical means (e.g., a mechanical sensor configured to detect physical profile variations), magnetic means (e.g., a sensor configured to detect changes in a magnetic field(s)), electrical means (e.g., a sensor that determines whether certain signal lines are high or low, or a sensor that detects a resistance value of one or more resistive components of an ELT), or any combination thereof.

Figure 3A:
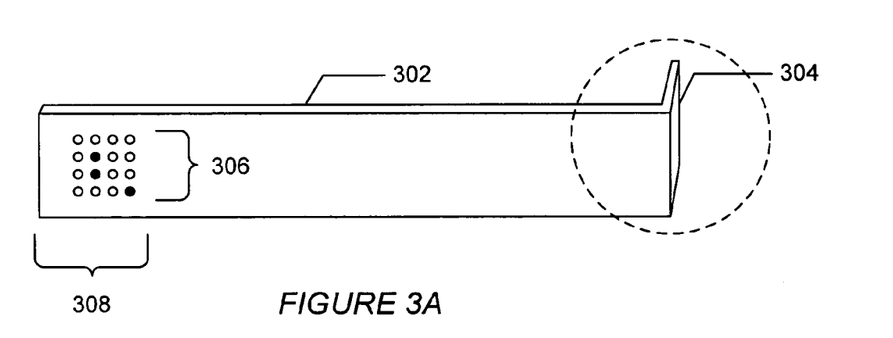
Figure 3B:
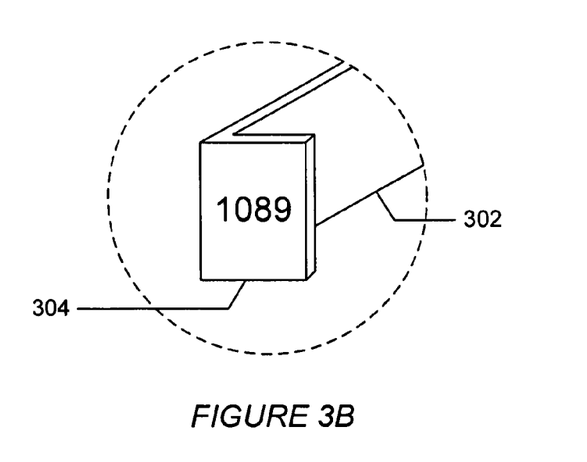

FIGS. 3A and 3B show an ELT (302) in accordance with an embodiment of the invention. Specifically, FIGS. 3A and 3B show a machine-readable form of a location value (308) of an ELT (302) in accordance with an embodiment of the invention. The example in FIG. 3A shows a machine-readable form of the location value (308) of the ELT (302) that has been encoded optically to represent a binary format number. By starting at the top-left corner of the dots (306) and reading horizontally, then vertically, an optical sensor (not pictured) would read a binary value "0000 0100 0100 0001" ("1089" in decimal format). The number encoded on the machine-readable form of the location value (308) of the ELT (302) corresponds to a location value of the component printed in human-readable form on an end (304) of the ELT (302). FIG. 3B shows the ELT (302) with a human-readable value "1089" appearing on the end (304) of the ELT (302).

Figure 4:
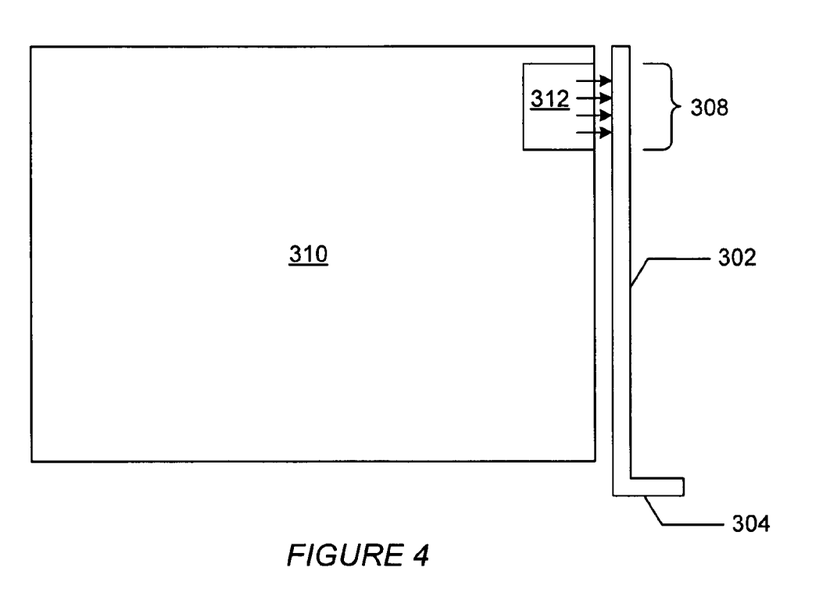
FIG. 4 shows a network component and an electronic location tag in accordance with an embodiment of the invention.

FIG. 4 shows a network component (310) and the ELT (302) (shown in FIG. 3) in accordance with an embodiment of the invention. The network component (310) includes an optical sensor (312) configured to read the machine-readable form of the location value (308) of the ELT (302). The machine-readable form of the location value (308), interpreted by the sensor (312), may then be transferred to the network component (310), which may in turn transfer the value to another device on a network (e.g., remote system (110) in FIG. 1). When the network component (310) is mounted on a particular shelf in a component rack or a similar device (e.g., component rack (104b in FIG. 1), the human-readable location value on the end (304) of the ELT (302), corresponding to the machine-readable form of the location value (308), is visible to a user (e.g., a service technician). Accordingly, a user may assign an ELT having a particular location value (in human-readable form) to a given network component. That network component can then read the location value (i.e., the machine-readable form of the value) off of the ELT. Thus, a network component may be easily identified using the human-readable location value on the front of the ELT as well as by querying the network component for the location value of the ELT (which the network component obtained from the machine-readable form of the value on the ELT).

Figure 5:
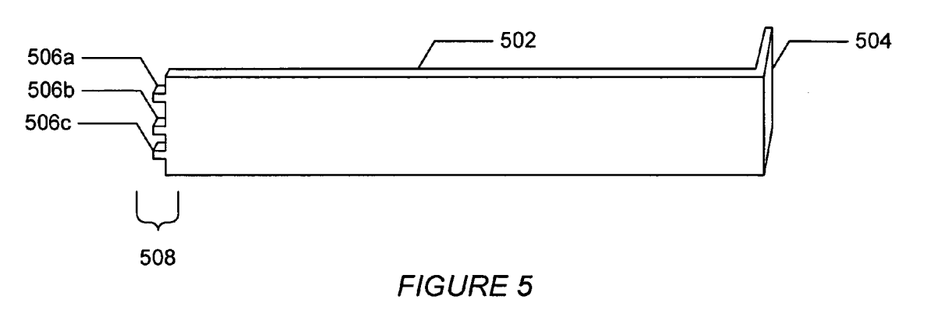

FIG. 5 shows an ELT (502) in accordance with an embodiment of the invention. Specifically, FIG. 5 shows a machine-readable form of a location value (508) of an ELT (502) in accordance with an embodiment of the invention. In FIG. 5, the machine-readable form of the location value (508) of the ELT (502) has been encoded mechanically with tabs cut in particular locations on one end of the ELT (502) to represent a binary format number. Specifically, the tabs (506a, 506b, 506c) are used to encode a machine-readable form of a location value that may be read by a sensor in a component rack (not pictured) in a manner shown and described in FIG. 6. The number encoded on the machine-readable form of the location value (508) of the ELT (502) corresponds to a human-readable location value printed on the end face (504) of the ELT (502).

Figure 6:
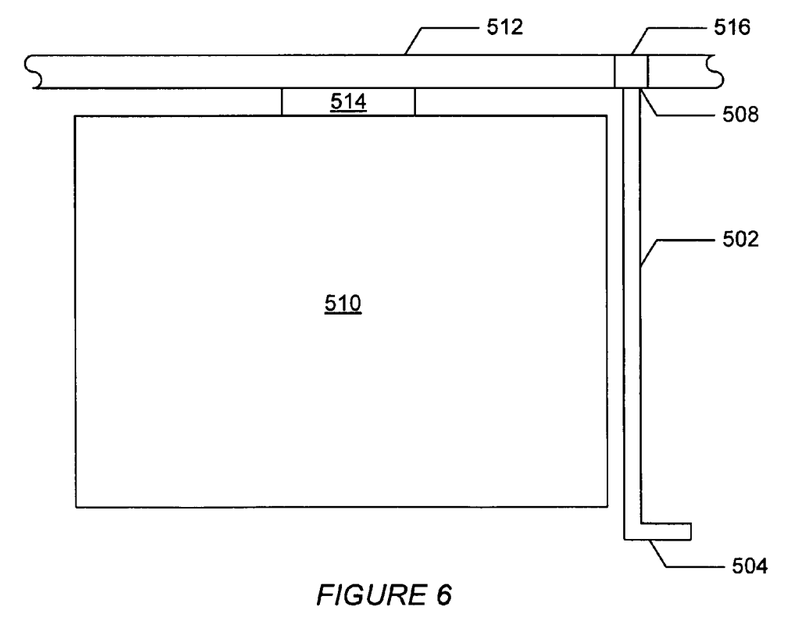
FIG. 6 shows a network component, a midplane, and an electronic location tag in accordance with an embodiment of the invention.

FIG. 6 shows a network component (510), a midplane (512) of a component rack (not pictured), and the ELT (502) (shown in FIG. 5) in accordance with an embodiment of the invention. The midplane (512) includes a mechanical sensor (516) that is configured to sense the tabs (506a, 506b, 506c in FIG. 5) of the machine-readable form of the location value (508) of the ELT (502) when the network component (510) is inserted into the component rack (not pictured). The value read by the sensor (516) may then be transferred to the network component (510) via a connection (514) connecting the midplane (512) to the network component (510). The network component may then transfer the value to another device (e.g., remote system (110) on network (108) in FIG. 1). When the network component (510) is mounted in a component rack (e.g., server rack (104b) in FIG. 1), the human-readable location value, corresponding to the machine-readable form of the location value (508), is visible to a user. Accordingly, as discussed above with respect to FIG. 4, a user may assign one or more ELTs with particular values to a given network component.

Figure 7A:
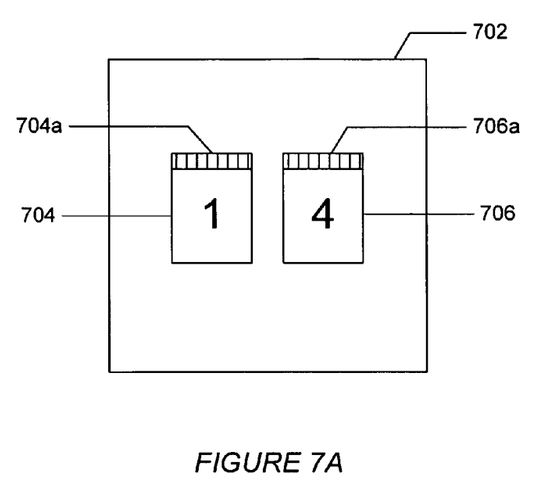
FIG. 7A shows an electronic location tag in accordance with an embodiment of the invention.
Figure 7B:
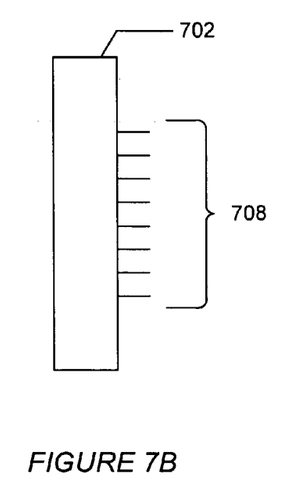
FIG. 7B shows an electronic location tag in accordance the embodiment of the invention shown in FIG. 7A.
Figure 7C:
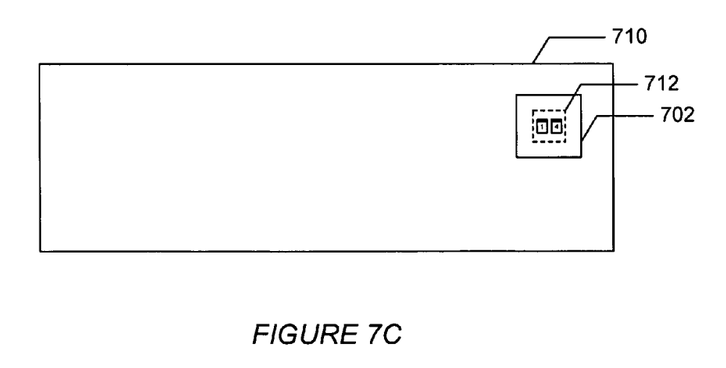
FIG. 7C shows a network component and an electronic location tag in accordance with an embodiment of the invention.

FIGS. 7A, 7B, and 7C show an example of how one or more ELTs may be used within a network computing system in accordance with one embodiment of the present invention. FIGS. 7A and 7B show an ELT (702) in accordance with an embodiment of the invention. Specifically, FIG. 7A shows an ELT (702) to be inserted into a receptacle located on a network component (not pictured). In FIG. 7A, the machine-readable form of the location value on the ELT (702) is encoded by a user via one or more thumb switches (704, 706), which also change the human-readable value of the ELT. A first dial (704a) is used to set a first part of human-readable value "1" of the ELT (702). Similarly, a second dial (706a) is used to set a second part of a human-readable value "4" of the ELT (702). In other words, the ELT (702) includes two digits (values) corresponding to a location value of the ELT. The human-readable form of the location value found on the ELT ("14") corresponds to the machine-readable form of the location value of the ELT. As shown in FIG. 7B, the location value of the ELT (702) is electrically transferred to a network component (not pictured) via a number of pins (708) protruding from a back surface of the ELT (702). The pins of the ELT (702) are inserted into a receptacle (not pictured) of a network component (described below). In one embodiment of the invention, the machine-readable form of the location value that is encoded by the user corresponds to a selected resistor value that is read by a sensor associated with the network component.

FIG. 7C shows an ELT (702) inserted into a receptacle (712) of a network component (710). The ELT is positioned in a location easily accessible by a user, so that the human-readable location value is easily read by a user. The network component (710) is configured to read the machine-readable form of the location value of the ELT (702). The location value of the ELT (702) (i.e., the machine-readable form of the location value and the human-readable location value) corresponds to a physical location of the network component (710). Thus, a user may assign an ELT a particular location value and then associate this location value with a particular network component in a given physical location.

As discussed above, an ELT having a particular location value may be assigned to and recognized by a particular network component. This allows a location value to be associated with an electronic value that may be correlated to other properties of the network component (e.g., serial number, IP address, etc.).

Figure 8:
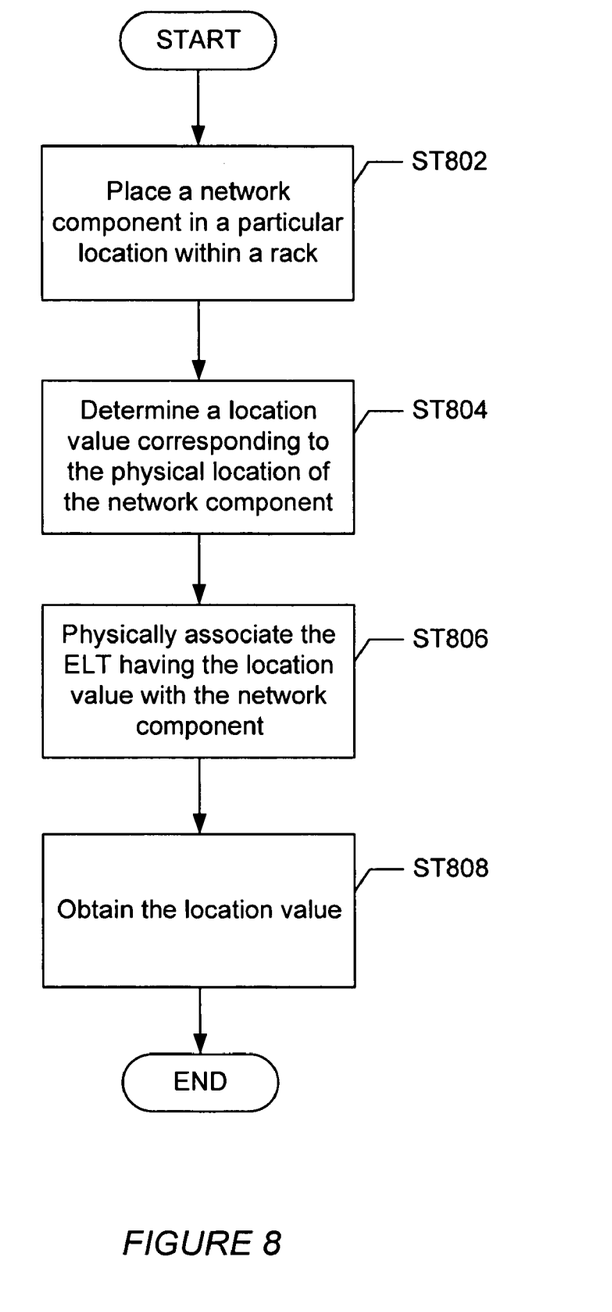
FIG. 8 shows a flow chart detailing a method for setting up a system having an electronic location tag in accordance with an embodiment of the invention.

FIG. 8 shows a flowchart in accordance with an embodiment of the invention describing a set-up process for assigning an ELT with a given location value to a network component. Initially, a network component is placed in a particular location within a component rack (e.g., a sever rack) (Step 802). Then, a location value corresponding to the physical location within the component rack is determined (Step 804). For example, a location value may be derived from a rack number and a shelf number where the network component is located.

An ELT (or group of ELTs) comprising the determined location value is then physically associated with the network component (Step 806). For example, a mechanically encoded ELT with a particular location value may be inserted into a reader that is part of a midplane of a component rack as shown and described in FIGS. 5 and 6. Alternatively, an electrically encoded ELT with a particular location value may be inserted into a reader that is part of a network component as shown and described in FIGS. 7A-7C. Accordingly, when the ELT is inserted into the appropriate reader, the reader interprets the location value of the ELT, which may then be stored in an appropriate memory in the ELT, in the network component, or in another appropriate component (e.g., a remote system) in a network computing system. Alternatively, the location value may be accessed by a user who determines an appropriate course of action for using or storing the location value of the ELT. One skilled in the art will appreciate that a number of such location values may be stored in a memory to keep a history of locations of one or more network components associated with the location value of a given ELT.

Those skilled in the art will appreciate that the ELT can be configured manually even if the network component is turned off or a power supply is shut off. Further, those skilled in the art will appreciate that the location value of the ELT may be human-assigned, or manually configurable, when the network component is installed. While the ELT may be manufactured with a human-readable location value and a machine-readable form of the location value, the ELT is physically associated with the network component by a human user (Step 806).

Subsequently, the location value of the ELT is obtained (Step 808). In one embodiment of the invention, when the network component is turned on and operating normally, the location value of the ELT is obtained (from the machine-readable form of the location value) by the network component. Alternatively, in one or more embodiments of the invention, the network component may not be turned on, or may not be working properly, In such a case, the location value of the ELT, as well as other possible values (e.g., a note on the health of the network device, the serial number of the device, a network ID for the network device, etc.), is obtained. The location value of the ELT (as well as the other possible values) may be recorded by a user on a separate device (e.g., a database on a laptop, which may be later uploaded to a server). This location value of the ELT, which uniquely identifies the network component, may be translated to a corresponding physical location of the network component in a server farm (or wherever the server or component of the server is physically located).

Alternatively, in one or more embodiments of the invention, the value of an ELT may be recorded when the corresponding network component is installed. This allows a user to be alerted that the network component is not working (or not working properly) when an attempt is made to obtain the location value of the ELT. Because the value of an ELT was previously recorded, when that location value of the ELT is not obtained, it may be determined that the network component is not working properly.

In one embodiment of the invention, a remote system connected to a group of network components may poll the network components periodically to determine various information from the network components. In one embodiment of the invention, the remote system polls each network component for the location value(s) of any associated ELTs. Once the location values of the ELT are obtained, the values are recorded by the remote system. Alternatively, the location value may be translated to a corresponding physical location of the network device and saved. If a network component or some component related to the network component is malfunctioning or has failed, a user must locate the failed network component to service or replace it. The location values of any ELTs associated with the failed network component which were previously saved may then be accessed to determine the physical location of the failed network component. Alternatively, the location values of the ELTs may be obtained at the time the server (or a component within the server) fails or requires maintenance. One skilled in the art will appreciate that since the location value of the ELT may be recorded independently (e.g., by a user when the network device is installed), a history of the location value of the ELT may be created. This history allows the network device to be located even when the network device cannot automatically determine the location value of the ELT.

Figure 9:
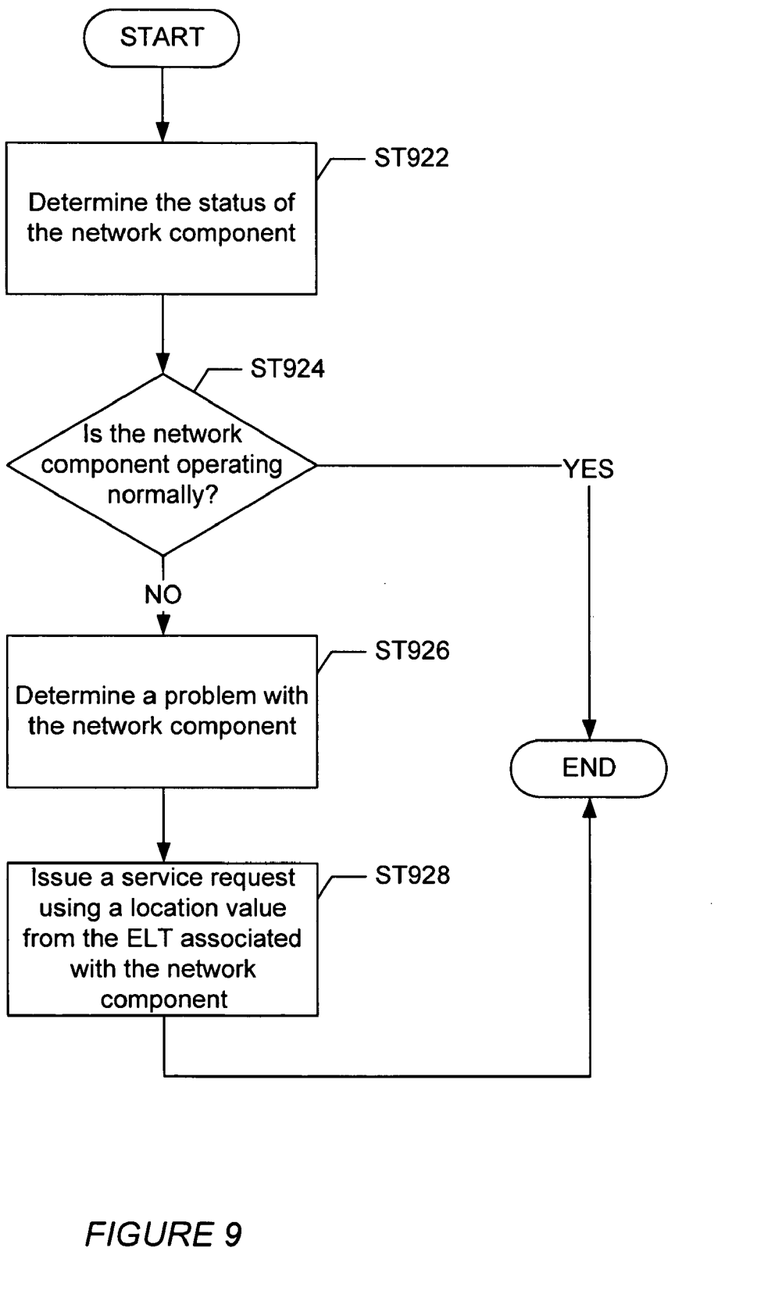
FIG. 9 shows a flow chart detailing a method for using a system having an electronic location tag in accordance with an embodiment of the invention.

FIG. 9 shows a flow diagram of a method of using a system having an electronic location tag in accordance with an embodiment of the invention. The following method may be used, for example, to physically locate a faulty network component among a plurality of similar components. Initially, the status of a network component is determined (Step 922). If the network component is operating normally, then the process ends. However, if a determination is made that the network component is not operating normally (Step 924), an attempt is made to determine a problem with the network component (Step 926). For example, a hardware device, such as a hard drive associated with the network component, may not be operating properly, or the network device itself may have failed and it may not be possible to communicate with the network component (which indicates that the network component is currently inoperative). Alternatively, as discussed above with reference to Step 808, it may be known that the network device is not operating properly, or is turned off. Thus, a recorded history of the location value of the ELT may be used to locate the network device.

Once a problem has been determined for the network component (or at least once it is determined that the network component must be fixed, etc.), a service request is issued with a location value corresponding to physical location of the network component (Step 928). The location value corresponding to the physical location of the network component is derived from the stored ELT information associated with the network component.

Thus, as discussed above, the location value(s) of any ELTs associated with the network component, which were saved by a remote system, may be accessed to determine the physical location of the network component. The physical location of the network component is obtained by the network component from a machine-readable form of a location value corresponding to a human-readable location value on the ELT(s) associated with the network component, where the ELT(s) associated with the network component denotes the physical location of the associated network component. Thus, a service technician may find the network component by locating the human-readable form of the ELT(s) in the appropriate component rack. Those skilled in the art will appreciate that although the above flowchart has been described with respect to a rack-mountable system, any suitable method for placing a network component in an ordered network computing system may be used.

Figure 10:
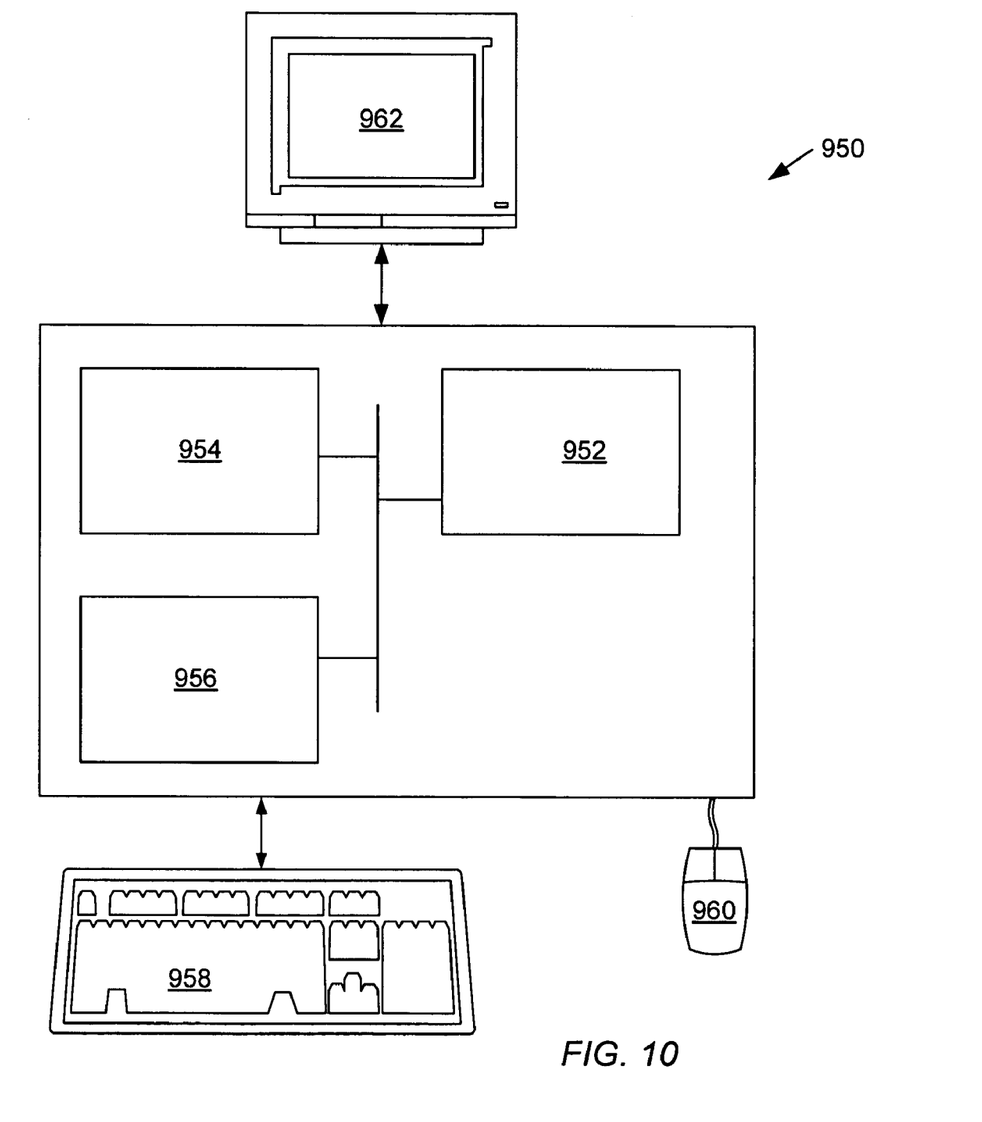
FIG. 10 shows computer system in accordance with an embodiment of the invention.

The method described in FIG. 9 may be implemented on virtually any type of computer, regardless of the platform being used. For example, as shown in FIG. 10, a networked computer system (950) includes a processor (952), associated memory (954), a storage device (956), and numerous other elements and functionalities typical of today's computers (not shown). The networked computer (950) may also include input means, such as a keyboard (958) and a mouse (960), and output means, such as a monitor (962). The networked computer system (950) is connected to a local area network (LAN) or a wide area network via a network interface connection (not shown). Those skilled in the art will appreciate that these input and output means may take other forms. Further, those skilled in the art will appreciate that one or more elements of the aforementioned computer (950) may be remotely located and connected to the other elements over a network. Further, software instructions to perform embodiments of the invention may be stored on a computer readable medium such as a compact disc (CD), a diskette, a tape, a file, or any other computer readable storage device on one or more network components or remote systems.

Embodiments of the invention allow a network component to be easily identified among any number of similar (or identical) devices, even if the network component is not functioning, or not functioning properly. Additionally, embodiments of the invention provide a means for physically locating a network device without costly modifications, imparting structural damage, or weakening electromagnetic interference (EMI) integrity of the network component. Further, embodiments of the invention may be fabricated inexpensively from a wide variety of materials.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for determining a physical location of a network component mounted on a component rack, comprising:
    placing the network component in the physical location, wherein the network component comprises a sensor having a range;
    determining a location value identifying the physical location of the network component using a location scheme;
    obtaining an electronic location tag (ELT) comprising a first segment having a human-readable value set to the location value and a second segment having a machine-readable value set to the location value,
    wherein the human-readable value and the machine-readable value are located on an exterior of the ELT, and
    wherein the first segment and the second segment form an angle greater than zero degrees and less than 180 degrees;
    installing the ELT on at least one selected from a group consisting of the network component and the component rack by positioning the machine-readable value within the range of the sensor; and
    obtaining the location value of the network component by reading the machine-readable value on the exterior of the ELT using the sensor of the network component.

2. The method of claim 1, further comprising:
    determining a status of the network component after installing the ELT;
    determining whether the network component is operating within normal operating parameters; and
    issuing a service request for the network component after obtaining the location value by reading the machine-readable value using the sensor, wherein the service request comprises the human-readable value of the location value identifying the physical location of the network component.

3. The method of claim 1, wherein the physical location of the network component corresponds to a location in a server rack, wherein the server rack comprises a plurality of shelves, and wherein the location scheme comprises a rack identification component and a shelf identification component.

4. The method of claim 1, wherein the machine-readable value comprises at least one selected from a group consisting of an optically-encoded representation of the location value, a magnetically-encoded representation of the location value, a mechanically-encoded representation of the location value, and an electrically-encoded representation of the location value.

5. A network computing system, comprising
    a network component mounted on a component rack, comprising a sensor with a range, stored in a physical location within the network computing system;
    an electronic location tag (ELT) installed on at least one selected from a group consisting of the network component and the component rack, comprising:
        a first segment having a human-readable value set to a location value; and
        a second segment having a machine-readable value set to the location value,
        wherein the location value identifies the physical location of the network component,
        wherein the machine-readable value is within the range of the sensor after installing the ELT,
        wherein the human-readable value and the machine-readable value are located on an exterior of the ELT, and
        wherein the first segment and the second segment form an angle greater than zero degrees and less than 180 degrees; and
    a remote system operatively connected to the network component and configured to obtain the location value from a reading of the machine-readable value on the exterior of the ELT taken by the sensor of the network component.

6. The network computing system of claim 5, wherein the network component comprises a server.

7. The network computing system of claim 5, wherein the machine-readable value comprises at least one selected from a group consisting of an optically-encoded representation of the location value, a magnetically-encoded representation of the location value, a mechanically-encoded representation of the location value, and an electrically-encoded representation of the location value.

8. The network computing system of claim 5, wherein the physical location corresponds to a location in a server rack.

9. A computer readable storage medium comprising computer executable software instructions embodied therein for determining a physical location of a network component mounted on a component rack, the software instructions executable by a computer to:
    receive, from a remote system, a query for the physical location of the network component, wherein the network component comprises a sensor having a range;
    obtain, from the sensor of the network component, a reading of a machine-readable value located on an exterior of an electronic location tag (ELT),
    wherein the machine-readable value is set to a location value identifying the physical location of the network component,
    wherein the ELT comprises a first segment having a human-readable value set to the location value and a second segment having the machine-readable value set to the location value,
    wherein the first segment and the second segment form an angle greater than zero degrees and less than 180 degrees, and
    wherein the ELT is installed on at least one selected from a group consisting of the network component and the component rack; and
    sending the reading to the remote system in response to the query.

10. The method of claim 1, further comprising:
turning a dial of the ELT to set the human-readable value to the location value.

11. The method of claim 1, further comprising:
cutting a plurality of tabs on the ELT to set the machine-readable value to the location value.

12. The network computing system of claim 5, wherein the ELT further comprises:
a dial for setting the human-readable value to the location value.

13. The network computing system of claim 5, wherein the ELT further comprises:
a plurality of tabs with a plurality of cuts at plurality of locations, wherein the reading is based on the plurality of locations.

14. The method of claim 1, wherein the second segment exceeds the first segment in length.

15. The network computing system of claim 5, wherein the second segment exceeds the first segment in length.

16. The computer readable storage medium of claim 9, wherein the second segment exceeds the first segment in length.

* * * * *